(12) United States Patent
Miyazaki

(10) Patent No.: US 8,779,708 B2
(45) Date of Patent: Jul. 15, 2014

(54) BRUSHLESS MOTOR DRIVING CIRCUIT

(75) Inventor: Hiroshi Miyazaki, Hikone (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/236,674

(22) Filed: Sep. 20, 2011

(65) Prior Publication Data

US 2012/0074886 A1  Mar. 29, 2012

(30) Foreign Application Priority Data

Sep. 27, 2010  (JP) .................................. 2010-216189

(51) Int. Cl.
H02P 6/14  (2006.01)

(52) U.S. Cl.
USPC ............. 318/400.27; 318/254.1; 318/400.01; 318/400.34; 318/590; 363/58

(58) Field of Classification Search
USPC ............ 318/400.27, 245, 244, 254.1, 400.01, 318/400.34, 590, 434; 388/815, 811; 363/58
See application file for complete search history.

(56) References Cited

U.S. PATENT DOCUMENTS

| 6,351,399 | B2 * | 2/2002 | Takanashi et al. | ......... 363/56.05 |
| 2008/0224643 | A1 * | 9/2008 | Sakurai et al. | ................ 318/471 |
| 2008/0252244 | A1 * | 10/2008 | Palma et al. | ............. 318/400.32 |
| 2010/0060080 | A1 * | 3/2010 | Sawada et al. | .................. 307/48 |
| 2010/0308764 | A1 | 12/2010 | Suzuki et al. | |

FOREIGN PATENT DOCUMENTS

| JP | H03-190684 A | 8/1991 |
| JP | H6-104000 | 4/1994 |
| JP | H08-088968 | 4/1996 |
| JP | 2005-006467 | 1/2005 |
| JP | 2006-333561 | 12/2006 |
| JP | 2008-178200 | 7/2008 |
| JP | 2009-165280 | 7/2009 |

OTHER PUBLICATIONS

Office Action dated Dec. 25, 2012 issued in corresponding Japanese application No. 2010-216189.
Office Action dated Oct. 12, 2013 issued in corresponding Chinese application No. 2011 10290745.2 (w/English translation thereof).

* cited by examiner

*Primary Examiner* — Eduardo Colon Santana
*Assistant Examiner* — Iftekhar Mustafa
(74) *Attorney, Agent, or Firm* — Bacon & Thomas, PLLC

(57) ABSTRACT

A brushless motor driving circuit includes a battery for supplying a power to the brushless motor driving circuit; a driver circuit; a bridge circuit including a plurality of N-channel FETs; a control unit for rotating a brushless motor by switching the bridge circuit through the driver circuit based on a rotor position detection signal; a floating voltage generator for applying a voltage to a first group of the FETs of the bridge circuit; and a converter which is powered from the battery. The converter has an output connected to an input of the floating voltage generator for the first group of the FETs of the bridge circuit and an input of the driver circuit for a second group of the FETs of the bridge circuit to dedicatedly supply a power to gates of the FETs, and the control unit is powered from the battery without using the converter.

8 Claims, 6 Drawing Sheets

US 8,779,708 B2

BRUSHLESS MOTOR DRIVING CIRCUIT

FIELD OF THE INVENTION

The present invention relates to a driving circuit for driving a brushless motor; and, more particularly, to a driving circuit for driving a brushless motor in use for a rechargeable electric power tool.

BACKGROUND OF THE INVENTION

There has been disclosed a driving circuit for driving a DC brushless motor by employing a battery as its power source (see, e.g., Japanese Patent Application Publication No. H06-104000). In such a conventional example, when a control unit rotates a brushless motor by switching a bridge circuit including a plurality of field effect transistors (FETs) through a driver circuit based on a signal outputted from a position detection unit (not shown) of the brushless motor, a voltage to be supplied to gates of the FETs is generated by a floating voltage generator (bootstrap circuit).

In the meantime, as shown in FIG. 3, the higher voltage applied between the gate and the source (hereinafter, referred to as "gate/source voltage") results in lowering the on-resistance and thus decreasing the heat dissipation. On the other hand, the lower gate/source voltage results in raising the on-resistance and thus increasing the heat dissipation. In the case of the FET shown in FIG. 3, it is preferable to apply the gate/source voltage of 7 V or higher.

On the other hand, the control unit is typically formed of a microcomputer, and its driving voltage is about 3 or 5 V, which is lower than the required gate/source voltage.

In the case of a battery-powered electric power tool, the battery voltage is high in a fully charged state and becomes lower as the charged amount of battery becomes reduced. To increase the amount of work per one charging cycle, it may be necessary to operate the electric power tool even when the charged amount of battery is low and, thus, the battery voltage is low. However, when the battery voltage is lowered, the gate/source voltage of FET also becomes lowered, which causes the increased heat dissipation and making unstable the operation of the FET.

Accordingly, when the battery voltage becomes lower than a reference voltage, it is necessary to stop the operation of the electric power tool. Since, however, the reference voltage is higher than an operable voltage range of the control unit, stopping the operation of the electric power tool with reference to the reference voltage brings about the decrease in the amount of work per single charging cycle.

SUMMARY OF THE INVENTION

In view of the above, the present invention provides a brushless motor driving circuit capable of maintaining the operation of a brushless motor even when a battery voltage is lowered.

In accordance with an embodiment of the present invention, there is provided a brushless motor driving circuit including: a battery for supplying a power to the brushless motor driving circuit; a driver circuit; a bridge circuit including a plurality of N-channel field effect translators (FETs); a control unit for rotating a brushless motor by switching the bridge circuit through the driver circuit based on a rotor position detection signal; a floating voltage generator for applying a voltage to a first group of the FETs of the bridge circuit; and a converter which is powered from the battery. The converter has an output connected to an input of the floating voltage generator for the first group of the FETs of the bridge circuit and an input of the driver circuit for a second group of the FETs of the bridge circuit to dedicatedly supply a power to gates of the FETs, and the control unit is powered from the battery without using the converter.

In accordance with another embodiment of the present invention, there is provided a brushless motor driving circuit including: a battery for supplying a power to the brushless motor driving circuit; a driver circuit; a bridge circuit including a plurality of N-channel field effect translators (FETs); a control unit for rotating a brushless motor by switching the bridge circuit through the driver circuit based on a position detection signal; a first converter serving to dedicatedly supply a power to gates of a first group of the FETs of the bridge circuit; and a second converter serving to dedicatedly supply a power to gates of a second group of the FETs of the bridge circuit. An output voltage of the first converter is higher than that of the second converter, and the control unit is powered from the battery without using the first and the second converter.

When a voltage of the converter (or the first or second converter) is equal to or lower than a preset voltage, the control unit may stop the operations of the FETs. In addition, the brushless motor driving circuit may further include a temperature detecting unit arranged in the vicinity of the FETs. The control unit may vary the preset voltage depending on a temperature detected by the temperature detecting unit.

In accordance with the present invention, a power is supplied to gates of the FETs through the converter and, thus, it is possible to obtain stable operations of the FETs even when the battery voltage becomes lower. Further, although the battery voltage is slightly lowered, it is not necessary to stop the operations of the FETs. Accordingly, when being used for an electrical power tool, the amount of work per one charging cycle can be increased. Besides, the converter is used to dedicatedly supply a power to the gates of the FETs. The power is supplied from the battery, without passing through the converter, to the control unit having a high power consumption. Therefore, it is possible to employ the converter whose voltage rating is small.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
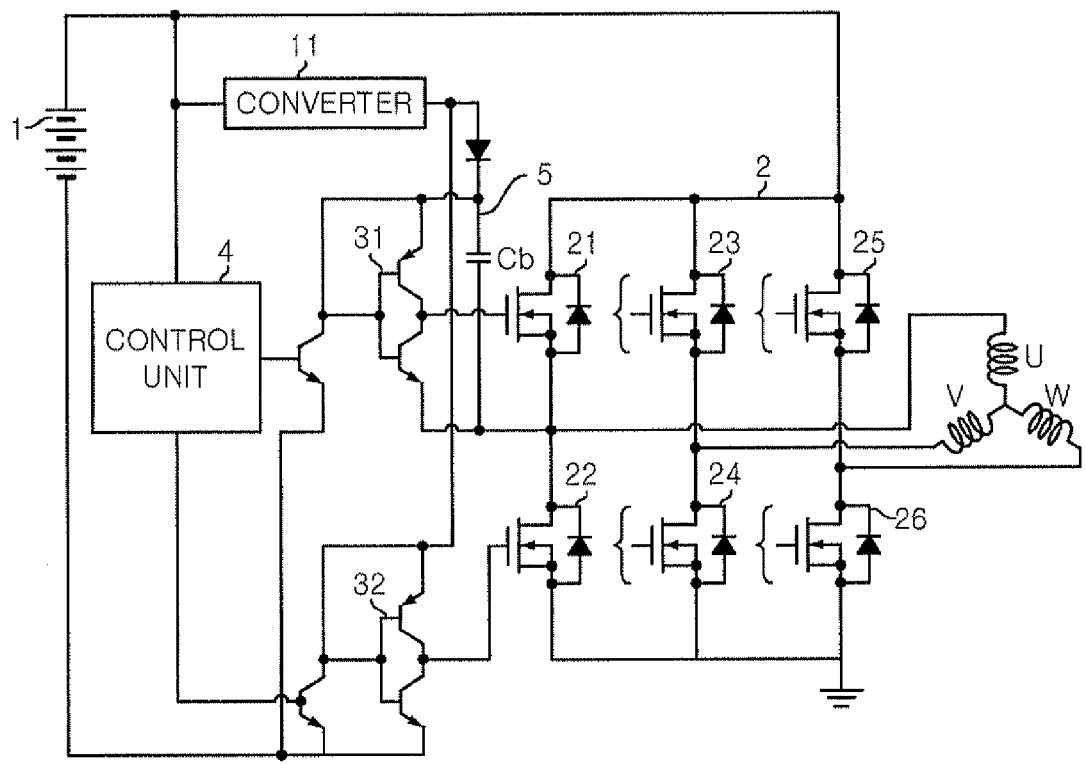
FIG. 1 is a schematic circuit diagram showing a driving circuit for driving a brushless motor in accordance with a first embodiment of the present invention.

Embodiments of the present invention will now be described with reference to the accompanying drawings which form a part hereof. FIG. 1 shows a driving circuit for driving a three-phase DC brushless motor by employing a battery 1 as its power source in accordance with a first embodiment of the present invention. Connected to three-phase coils U, V and W of the DC brushless motor is a bridge circuit 2 including 6 N-channel field effect transistors (FETs). Driver circuits 31 are respectively connected to the gates of FETs 21, 23 and 25; and driver circuits 32 are connected to the gates of FETs 22, 24 and 26, respectively. In FIG. 1, the driver circuits 31 and 32 connected to the FETs 23 to 26 are omitted for simplicity. Each of the driver circuits 31 and 32 is formed of a transistor bridge.

A control unit 4 which controls operations of the driver circuits 31 and 32 includes a distribution circuit into which a signal (rotor position detection signal) generated from a position detection unit (not shown) of the brushless motor is inputted. The control unit 4 determines, based on the rotor position detection signal, coils among the coils U, V and W through which to flow current in order to generate the rotary torque and outputs gate signals to the driver circuits 31 and 32. The driver circuits 31 and 32 receive the gate signals and selectively turn on the FETs 21 to 26. For example, when the FETs 21 and 24 are turned on, the current flows from the coil U to the coil V.

In FIG. 1, reference numeral "11" indicates a converter for supplying a voltage to the gates of the FETs 21 to 26. The converter 11 powered from the battery 1 has an output that is connected to an input of a floating voltage generator 5 for the driver circuit 31 of the FETs 21, 23 and 25 disposed at an upper stage of the bridge circuit 2. The output of the converter 11 is also connected to an input of the driver circuit 32 of the FETs 22, 24 and 26 disposed at a lower stage of the bridge circuit 2. The floating voltage generator 5 includes a bootstrap circuit having a bootstrap capacitor Cb as shown in FIG. 1.

Figure 2:
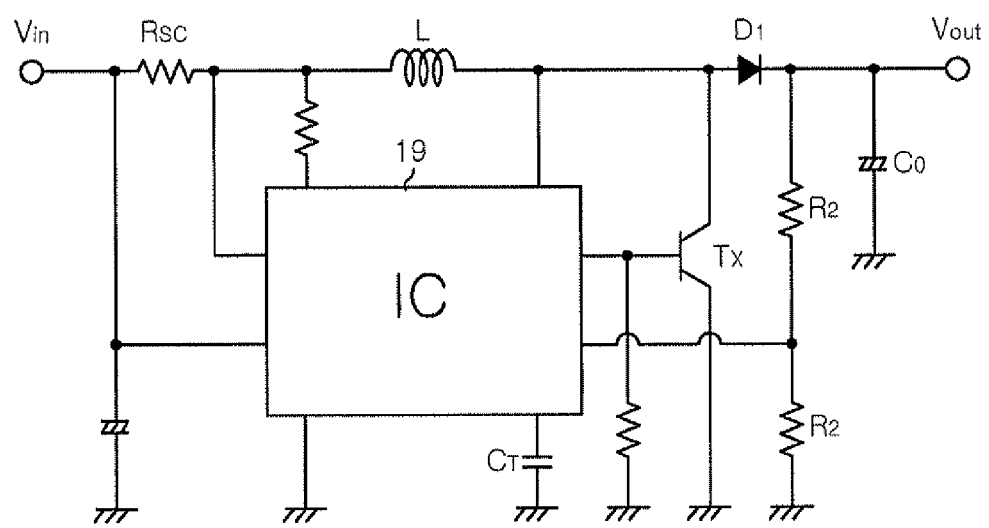
FIG. 2 is a circuit diagram showing a converter of the driving circuit.

As for the converter 11, a charge-pump converter may be employed, but a step-up converter shown in FIG. 2 is employed in the present embodiment. The converter 11 powered from the battery 1 as described above operates (or oscillates) a transistor Tx or stops the operation (or oscillation) of the transistor Tx by feeding back to an integrated circuit (IC) 19 division voltage of the voltage $V_{out}$ provided by resistors R1 and R2. When the battery voltage is sufficiently high, it is not necessary to supply a power from the converter 11. The values of the resistors R1 and R2 are set such that the operation of the transistor Tx is stopped when the battery voltage is sufficiently higher. When the operation of the transistor Tx is stopped, the battery voltage is supplied as the voltage $V_{out}$ through a resistor $R_{SC}$, a coil L and a diode D1.

However, when the battery voltage becomes lower, the voltage $V_{out}$ becomes decreased and, thus, the division voltage output of the resistors R1 and R2 fed back to the IC 19 becomes lower. The operation of the transistor Tx is started to supply the voltage stored in the coil L as a step-up voltage when the division voltage output of the resistors R1 and R2 is lower than a threshold value.

Figure 3:
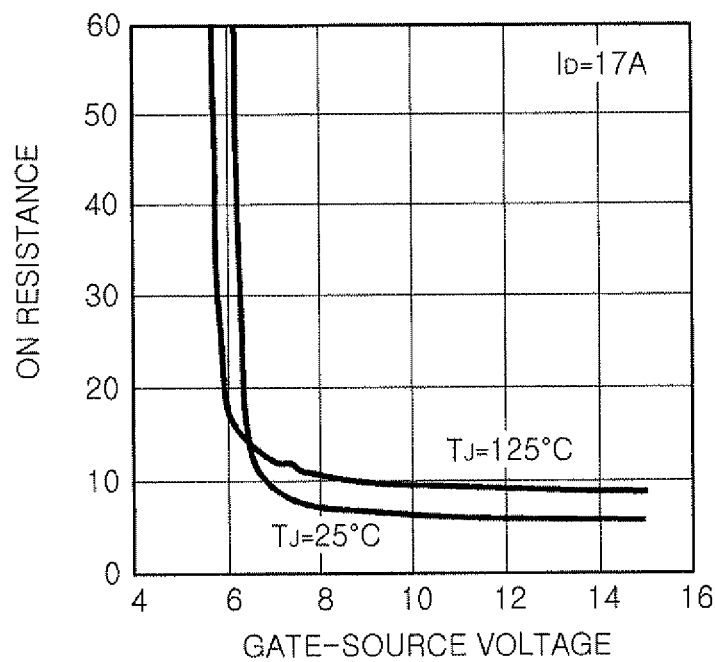
FIG. 3 explains a relationship between an on-resistance and a gate/source voltage of a FET.
Figure 4:
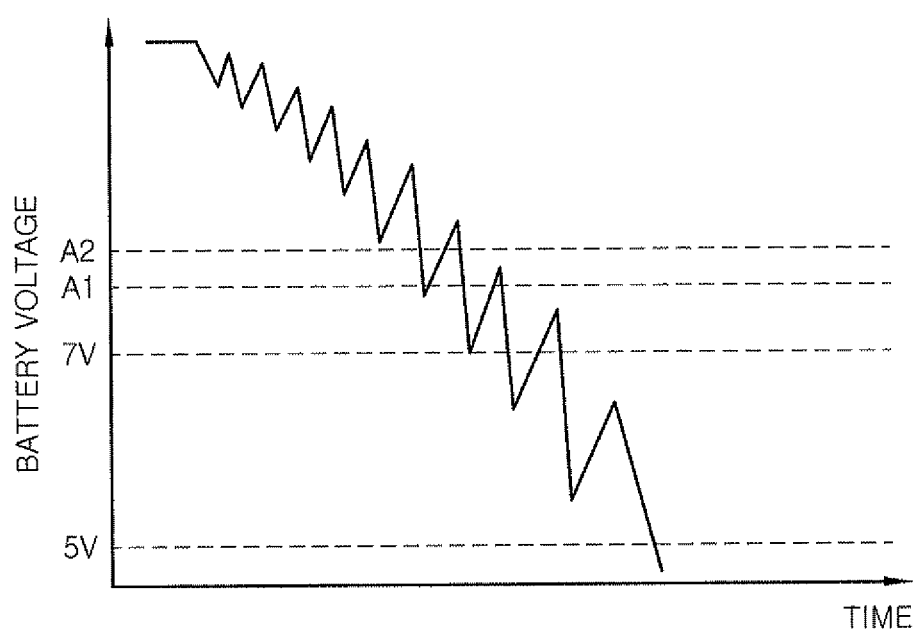
FIG. 4 is a time chart showing a variation of a battery voltage when the driving circuit is used in an electric power tool.

According to the relationship between the on-resistance and the gate/source voltage as described in conjunction with FIG. 3, it is necessary for the converter 11 to provide the output voltage $V_{out}$ greater than a value (7 V in the case of FIG. 3) to decrease the on-resistance even when the battery voltage becomes lower than 7V, for example. During a single operation, the battery voltage of an electric power tool using the brushless motor becomes decreasingly varied due to the variation of loads. Especially, in the case of an impact-type electric power tool, the battery voltage depicts the voltage variation curve as shown in FIG. 4.

In this case, if the converter 11 is configured to start the operation of the transistor Tx, when the battery voltage is lower than A1, the output voltage $V_{out}$ of the converter 11 may become temporarily less than 7 V in case the battery voltage drops fast below 7 V before the converter 11 provides the voltage $V_{out}$ higher than A1 due to a delay of step-up voltage generation. Accordingly, it is necessary to set the starting voltage of the converter 11 as a value (e.g., A2 or higher in FIG. 4) that is higher than A1 in consideration of the delay in step-up voltage generation of the converter 11.

As described above, in the case of a battery-powered electric power tool in which the battery voltage is high in a fully charged state and becomes lower as the charging amount of battery becomes reduced, it may necessary to operate the electric power tool even when the charged amount of battery is low and, thus, the battery voltage is also low, in order to increase the amount of work per one charging cycle. The conventional problem that the lowered battery voltage brings about the decrease in the gate/source voltage of FET thereby increasing the heat dissipation is solved in this embodiment by increasing the gate/source voltage by the converter 11 when the battery voltage is lowered.

In addition, the size and/or the rating of the converter 11 become larger as the power consumption becomes increased. Thus, if the control unit 4 that requires a high power consumption is also powered from the converter 11, the size and/or the rating of the converter 11 are also increased.

However, the lowest voltage required for the control unit 4 is lower than the gate/source voltage. Therefore, in this embodiment, the battery power is supplied from the battery 1 to the control unit 4 without passing through the converter 11 and, thus, it is possible to suppress the increase in the size and/or the rating of the converter 11.

Figure 5:
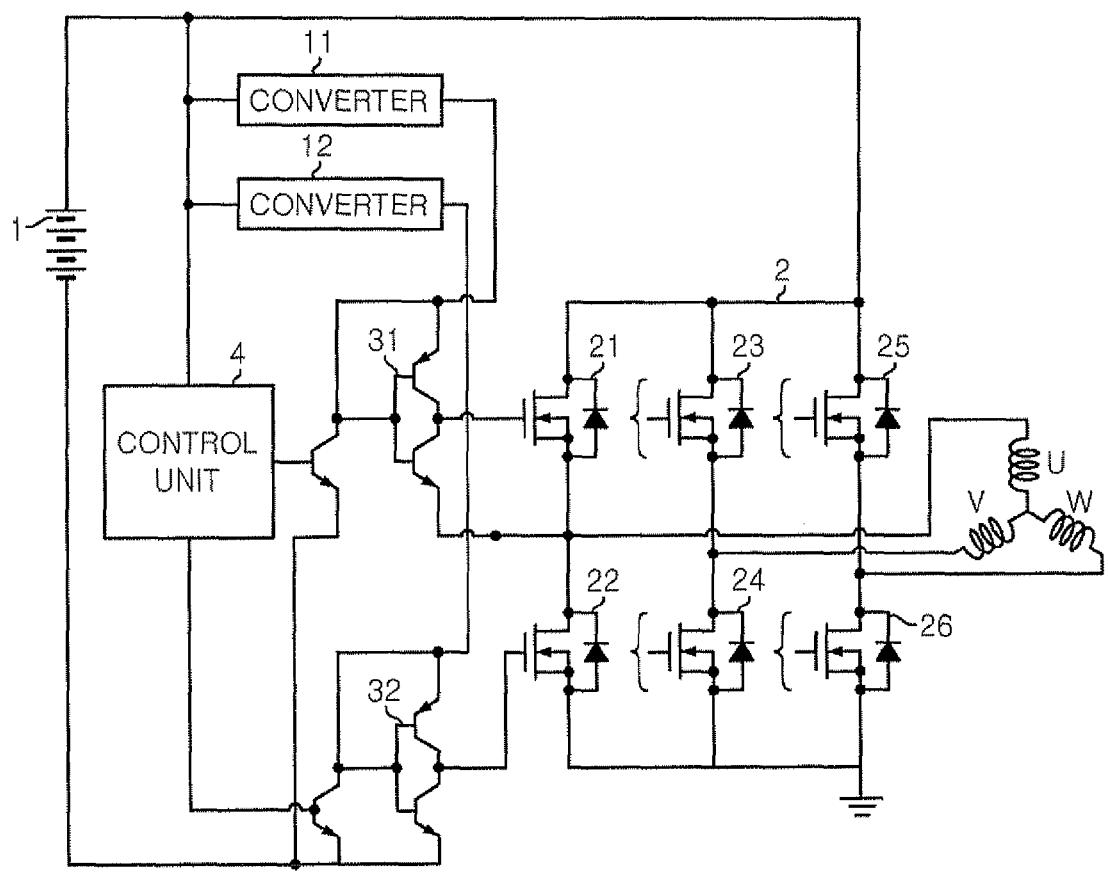
FIG. 5 is a schematic circuit diagram showing a driving circuit for driving a brushless motor in accordance with a second embodiment of the present invention.

FIG. 5 is a schematic circuit diagram showing a driving circuit for driving a brushless motor in accordance with a second embodiment of the present invention. In the present embodiment, a converter 12 is further included in addition to the converter 11, the converter 12 being connected to the input of the driver circuit 32 of the FETs 22, 24 and 26 disposed at the lower stage of the bridge circuit 2. Moreover, the converter 11 is directly connected to the input of the driver circuit 31 of the FETs 21, 23 and 25 disposed at the upper stage of the bridge circuit 2 without using the floating voltage generator 5 formed of the bootstrap circuit. At this time, since the voltage of the source of FETs 21, 23 and 25 disposed at the upper stage is substantially same as the battery voltage, it is preferable to satisfy the condition that the battery voltage plus the output voltage of the converter 12 is equal to the output voltage of the converter 11.

When viewed from the ground side, the voltage applied between the gate and the source of each of the FETs 21, 23 and 25 disposed at the upper stage requires the battery voltage plus the gate/source voltage of FET. For that reason, the bootstrap circuit is typically employed.

In the case of the bootstrap circuit, if the current continuously flows in the same phase due to motor lock or the like, the voltage of a bootstrap capacitor becomes lower. Accordingly, the bootstrap circuit may be adequate for such an electric power tool as a constantly rotatable impact driver. On the other hand, another type of electric power tool, e.g., a drill driver or a circular saw, including a motor which is locked when the load is increased, is maintained in an electrical connection state at a specific phase when being locked. Therefore, in such a case, the voltage of the capacitor becomes lowered, causing the lower gate/source voltage of FETs 21, 23 and 25 disposed at the upper stage.

However, in the present embodiment, the power can be supplied by the converters 11 and 12 without using the bootstrap circuit. This makes it possible to deal with the problem even when the motor is locked.

Figure 6:
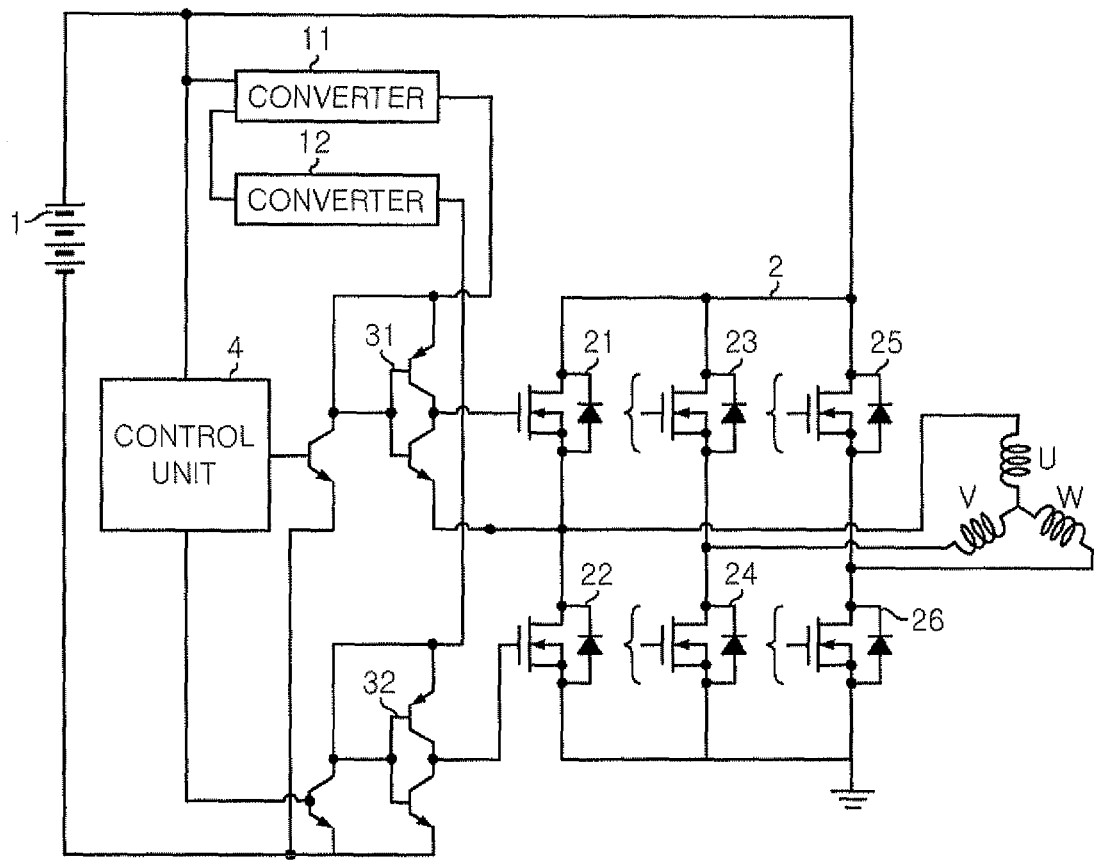
FIG. 6 is a schematic circuit diagram showing a driving circuit for driving a brushless motor in accordance with a third embodiment of the present invention.
Figure 7:
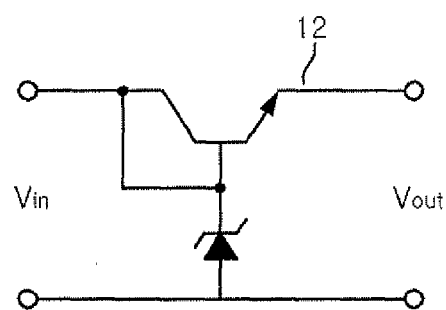
FIG. 7 is a circuit diagram showing a converter of the driving circuit.

In accordance with a third embodiment of the present invention, the converter 12 connected to the driver circuit 32 of the FETs 22, 24 and 26 disposed at the lower stage may be of a step-down type. In such a case, the converter 12 may be connected to the converter 11 as shown in FIG. 6. That is, the output of the converter 11 connected to the driver circuit 31 of the FETs 21, 23 and 24 disposed at the upper stage is connected to the input of the converter 12. In this case, the step-down converter 12 may be formed of, e.g., a series regulator shown in FIG. 7.

Figure 8:
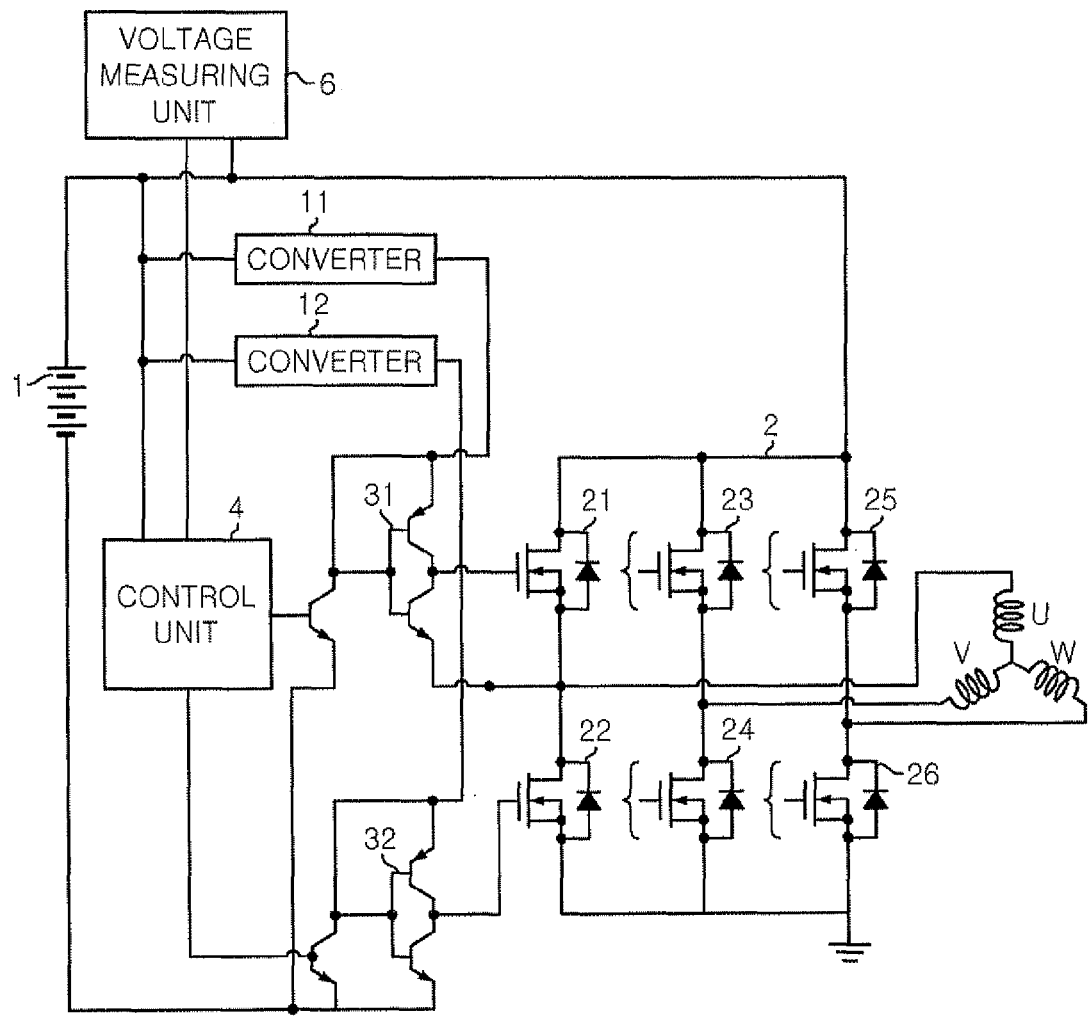
FIG. 8 is a schematic circuit diagram showing a driving circuit for driving a brushless motor in accordance with a fourth embodiment of the present invention.

FIG. 8 is a schematic circuit diagram showing a driving circuit for driving a brushless motor in accordance with a fourth embodiment of the present invention. The driving circuit of the present embodiment further includes a voltage measuring unit 6 measuring a battery voltage as compared with the second embodiment shown in FIG. 5. When the battery voltage detected by the voltage measuring unit 6 is equal to or smaller than a preset driving stop voltage, the control unit 4 stops the operation of the driving circuit.

Figure 9:
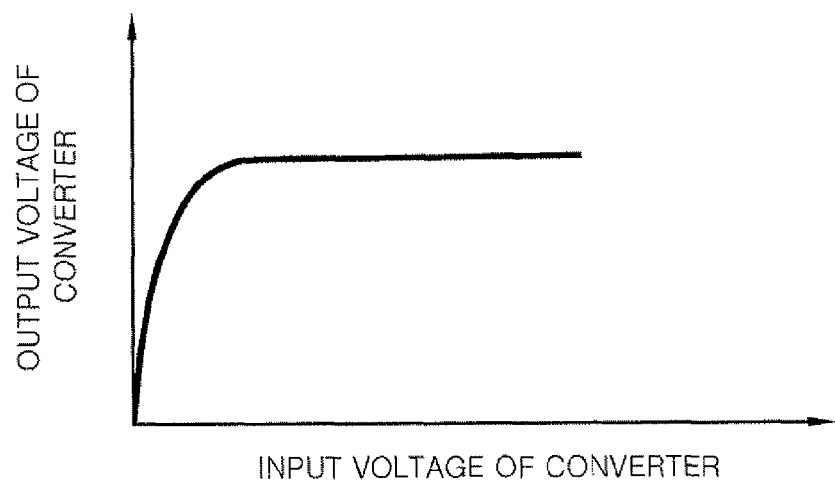
FIG. 9 explains a relationship between an output voltage and an input voltage of a converter.

As for the converters 11 and 12, the input voltage that is lower than a preset voltage results in lowering the output voltage and, thus, the driving stop voltage is set to be higher than the input voltage by which the output voltage is started to be lowered as shown in FIG. 9. The significantly lowered input voltage of the converter 11 or 12 results in stopping the operation and thus stopping the generation of the step-up voltage, which significantly lowers the gate/source voltage. In this embodiment, however, the operation of the driving circuit of the electric power tool is stopped if the gate/source voltage is significantly lowered. Thus, it is possible to prevent the damage of the FETs.

Measuring the battery voltage is equivalent to indirectly monitoring the output voltage of the converter 11 or 12. Therefore, instead of measuring the battery voltage, an output voltage of the converter 11 or 12 may be directly measured.

Figure 10:
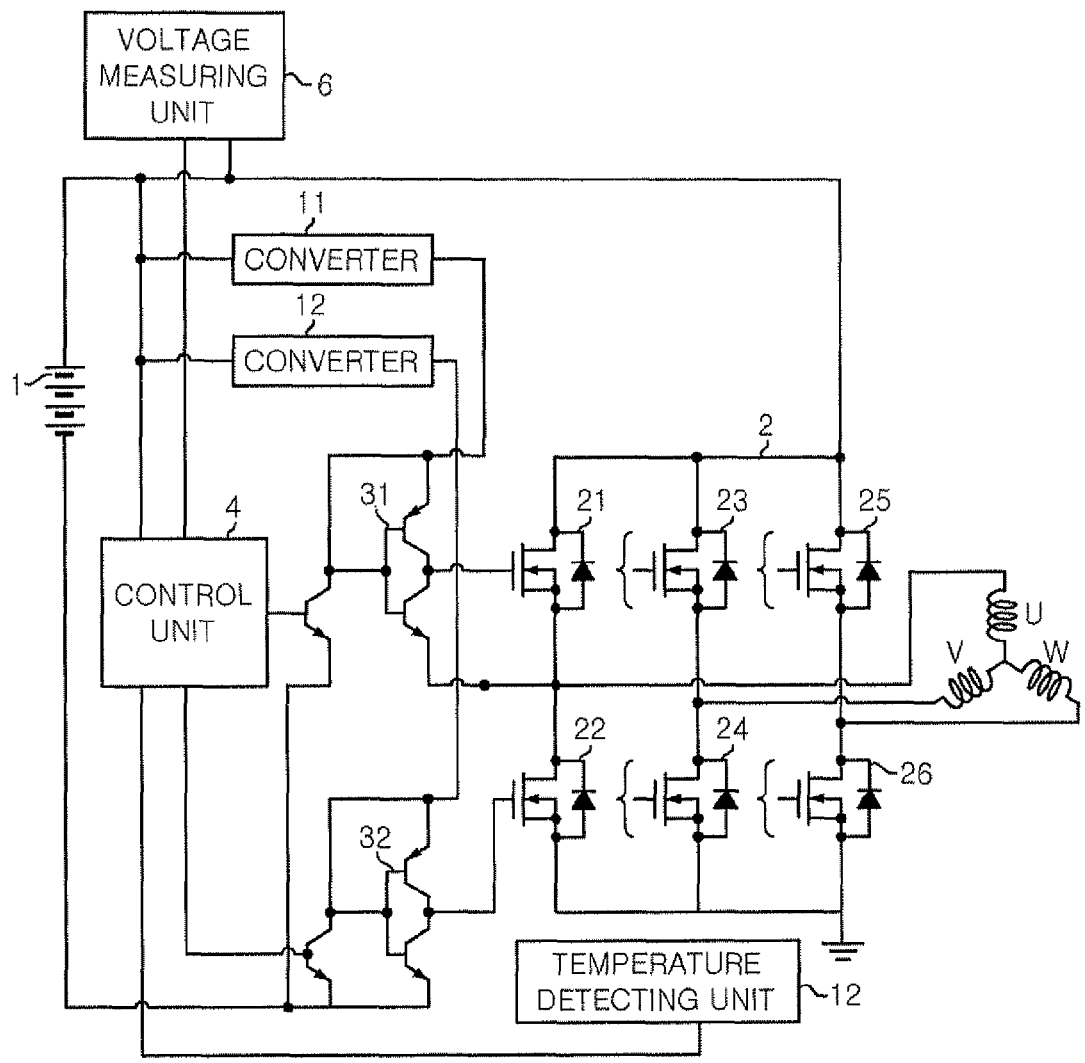
FIG. 10 is a schematic circuit diagram showing a driving circuit for driving a brushless motor in accordance with a fifth embodiment of the present invention.
Figure 11:
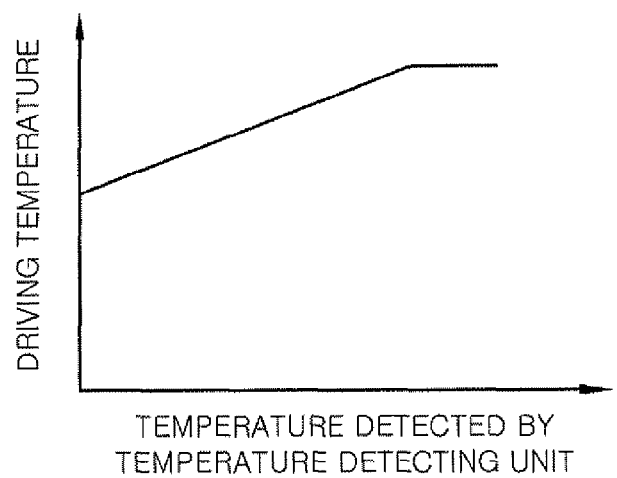
FIG. 11 explains a relationship between a detected temperature and a driving stop voltage.

FIG. 10 is a schematic circuit diagram showing a driving circuit for driving a brushless motor in accordance with a fifth embodiment of the present invention. Specifically, a temperature detecting unit 7 formed of, e.g., a thermistor or a posistor (positive temperature characteristic thermistor) is disposed in the vicinity of the FETs 21 to 26, and the temperature detected by the temperature detecting unit 7 is inputted into the control unit 4. Then, the control unit 4 determines the driving stop voltage depending on the detected temperature. Specifically, as shown in FIG. 11, the control unit 4 sets the driving stop voltage to be low when the detected temperature is low and high when the detected temperature is high.

Typically, the upper limit of the junction temperature (chip temperature) of FET is set to range from 150 to 175° C. The on-resistance of a FET affects its heat dissipation. If heat is generated at a lower temperature, it takes longer to reach the upper limit temperature. On the other hand, when heat is generated at a higher temperature, it takes shorter to reach the upper limit temperature. By setting the driving stop voltage depending on temperature, the driving circuit can be operated at a lower temperature when the battery voltage is lower, thereby extending the usable operation range.

Further, the internal resistance of a cell of the battery 1 is increased at a lower temperature and, thus, the voltage drop is increased when the current flows therethrough. This makes lower the voltage applied to the gate of the FET. Further, when the battery 1 is in a lower temperature state, both its environments and the FETs 21 to 26 are also expected to be in the lower temperature state. Accordingly, when the battery voltage is lower due to the lower temperature, the available operation range is also extended.

While the invention has been shown and described with respect to the embodiments, it will be understood by those skilled in the art that various changes and modifications may be made without departing from the scope of the invention as defined in the following claims.

What is claimed is:

1. A brushless motor driving circuit for driving a brushless motor including:
   a battery for supplying a power to the brushless motor driving circuit;
   a driver circuit;
   a bridge circuit including a first group and a second group of N-channel field effect translators (FETs);
   a control unit for rotating the brushless motor by switching the bridge circuit through the driver circuit based on a rotor position detection signal;
   a floating voltage generator for applying a voltage to the first group of the N-channel FETs of the bridge circuit; and
   a converter which is powered from the battery,
   wherein the converter has an output connected to an input of the floating voltage generator for the first group of the N-channel FETs of the bridge circuit and an input of the driver circuit for the second group of the N-channel FETs of the bridge circuit to dedicatedly supply a power to gates of the first group and the second group of the N-channel FETs,
   the control unit is powered from the battery without using the converter, and
   the converter is configured to determine a voltage of the output based on a voltage of the battery; and
   wherein, when the voltage of the battery is equal to or lower than a preset voltage, the control unit stops the operation of the first group and the second group of the N-channel FETs, and
   the preset voltage is determined based on a relationship between an input voltage and an output voltage of the converter.

2. The brushless motor driving circuit of claim 1, further comprising a temperature detecting unit arranged in the vicinity of the first group and the second group of the N-channel FETs,
   wherein the control unit varies the preset voltage depending on a temperature detected by the temperature detecting unit.

3. The brushless motor driving circuit of claim 1, wherein the converter is configured to apply a first voltage equal to the voltage of the battery to the output when the voltage of the battery is equal to or greater than a threshold value, and apply a second voltage greater than the voltage of the battery to the output when the voltage of the battery is smaller than the threshold value.

4. The brushless motor driving circuit of claim 3, wherein the converter is a step-up converter including a transistor, an integrated circuit, resistors and a coil, wherein the converter is configured to determine whether to operate the transistor or stop an operation of the transistor by feeding back a division voltage of the voltage of the output provided by the resistors to the integrated circuit, and wherein the converter stops the operation of the transistor when the voltage of the battery is equal to or greater than the threshold value, and operates the transistor by supplying a voltage stored in the coil as the second voltage to the output when the voltage of the battery is smaller than the threshold value.

5. A brushless motor driving circuit for driving a brushless motor including:

a battery for supplying a power to the brushless motor driving circuit;

a driver circuit;

a bridge circuit including a first group and a second group of N-channel field effect translators (FETs);

a control unit for rotating the brushless motor by switching the bridge circuit through the driver circuit based on a rotor position detection signal;

a first converter serving to dedicatedly supply a power to gates of the first group of the N-channel FETs of the bridge circuit; and a second converter serving to dedicatedly supply a power to gates of the second group of the N-channel FETs of the bridge circuit, wherein an output voltage of the first converter is higher than an output voltage of the second converter, the control unit is powered from the battery without using the first and the second converter, each of the first and the second converter is powered from the battery, and the first converter is configured to determine the output voltage thereof based on a voltage of the battery; and wherein, when the voltage of the battery is equal to or lower than a preset voltage, the control unit stops the operation of the first group and the second group of the N-channel FETs, and the preset voltage is determined based on a relationship between an input voltage and the output voltage of the first converter, and a relationship between an input voltage and the output voltage of the second converter.

6. The brushless motor driving circuit of claim 5, further comprising a temperature detecting unit arranged in the vicinity of the first group and the second group of the N-channel FETs, wherein the control unit varies the preset voltage depending on a temperature detected by the temperature detecting unit.

7. The brushless motor driving circuit of claim 5, wherein the first converter is configured to supply a first voltage equal to the voltage of the battery as the output voltage thereof when the voltage of the battery is equal to or greater than a threshold value, and supply a second voltage greater than the voltage of the battery as the output voltage thereof when the voltage of the battery is smaller than the threshold value.

8. The brushless motor driving circuit of claim 7, wherein the first converter is a step-up converter including a transistor, an integrated circuit, resistors and a coil, wherein the first converter is configured to determine whether to operate the transistor or stop an operation of the transistor by feeding back a division voltage of the output voltage provided by the resistors to the integrated circuit, and wherein the first converter stops the operation of the transistor when the voltage of the battery is equal to or greater than the threshold value, and operates the transistor by supplying a voltage stored in the coil as the second voltage when the voltage of the battery is smaller than the threshold value.

* * * * *